United States Patent [19]

Datta et al.

[11] Patent Number: 5,284,554

[45] Date of Patent: Feb. 8, 1994

[54] ELECTROCHEMICAL MICROMACHINING TOOL AND PROCESS FOR THROUGH-MASK PATTERNING OF THIN METALLIC FILMS SUPPORTED BY NON-CONDUCTING OR POORLY CONDUCTING SURFACES

[75] Inventors: Madhav Datta, Yorktown Heights; Lubomyr T. Romankiw, Briarcliff Manor, both of N.Y.

[73] Assignee: International Business Machines Corporation, Armonk, N.Y.

[21] Appl. No.: 819,310

[22] Filed: Jan. 9, 1992

[51] Int. Cl.$^5$ .................... B23H 3/10; B23H 9/06; B23H 7/32
[52] U.S. Cl. .................... 204/129.5; 204/129.65; 204/129.7; 204/129.75; 204/224 M; 204/225; 204/284; 204/240
[58] Field of Search ............ 204/129.5, 129.7, 129.75, 204/129.65, 224 M, 225, 284, 240

[56] References Cited

U.S. PATENT DOCUMENTS

| | | | |
|---|---|---|---|
| 2,745,805 | 5/1956 | Jones, Jr. .................... | 204/224 M X |
| 3,162,588 | 12/1964 | Bell .................... | 204/141 |
| 3,208,923 | 9/1965 | Feiner et al. .................... | 204/129.6 |
| 3,235,475 | 2/1966 | Williams .................... | 204/129.1 |
| 3,276,988 | 10/1966 | Williams .................... | 204/284 |
| 3,325,384 | 6/1967 | Frantzen .................... | 204/143 |
| 3,421,997 | 1/1969 | Williams .................... | 204/224 M X |
| 3,448,023 | 6/1969 | Bell .................... | 204/209 |
| 3,580,834 | 5/1971 | Sedgwich .................... | 204/224 M |
| 3,793,170 | 2/1974 | Andrews .................... | 204/224 M |
| 4,045,312 | 8/1977 | Satoshi .................... | 204/129.65 |
| 4,083,767 | 4/1978 | Suslin .................... | 204/224 M |
| 4,193,852 | 3/1980 | Inoue .................... | 204/129.46 |
| 4,202,739 | 5/1980 | Csakuary et al. .................... | 204/129.35 |
| 4,729,940 | 3/1988 | Nee et al. .................... | 204/129.65 X |
| 4,786,381 | 11/1988 | Mohr et al. .................... | 204/129.75 |
| 5,032,244 | 7/1991 | Bommier et al. .................... | 204/224 M X |
| 5,061,352 | 10/1991 | Kelly et al. .................... | 204/129.75 X |

FOREIGN PATENT DOCUMENTS 933731 8/1963 United Kingdom .

OTHER PUBLICATIONS

Extended Abstracts, vol. 89, No. 2, 1989, p. 342: C. Clerc, M. Datta and L. T. Romankiw, "High Speed Maskless Patterning By Electrolytic Jet".
Patent Abstracts of Japan, vol. 13, No. 260: JP-A-10 62 499 (Mar. 8, 1989).

*Primary Examiner*—Donald R. Valentine
*Attorney, Agent, or Firm*—Scully, Scott, Murphy & Presser

[57] ABSTRACT

The present invention describes a high speed, high precision electrochemical micromachining tool, chemical solution and method for the one sided through-mask micropatterning of conducting foils and films supported by insulating material. The tool of the present invention can include either a movable plate means allowing for the movement of the workpiece to and fro above the cathode assembly, or a movable cathode assembly means allowing for the movement of said cathode assembly to and fro beneath the workpiece. Said cathode assembly also consists of a nozzle assembly from which the electrolytic solution emerges as electrolytic shower and impinges upon the workpiece. Methods to resolve the problems related to the loss of electrical contact during the electrochemical micromachining process are also described.

31 Claims, 5 Drawing Sheets

ELECTROETCHING OF SLIDER SUSPENSION

ELECTROETCHING OF NAPA SUSPENSION

ELECTROCHEMICAL MICROMACHINING TOOL AND PROCESS FOR THROUGH-MASK PATTERNING OF THIN METALLIC FILMS SUPPORTED BY NON-CONDUCTING OR POORLY CONDUCTING SURFACES

TECHNICAL FIELD

The present invention relates to the fabrication of electronic components requiring high precision patterning of thin metallic films supported by non-conducting or poorly conducting surfaces. The present invention more specifically relates to a tool, chemical solution and process which enables electroetching of metal patterns on a non-conducting surface by means of through-mask processing. The present invention discloses a high speed, high precision electrochemical micromachining tool and process for the one sided through-mask micropatterning of conducting foils and films supported by insulating material. Methods to resolve the problems related to the loss of electrical contact during the electrochemical micromachining process which are generally encountered in one sided electroetching are also described. The electrochemical micromachining tool and process will be applicable to different products that involve one sided etching for micropatterning, for example, slider suspension, TAB, controlled collapsible tip connection (C4), and the like.

PRIOR ART

The fabrication of many electronic components involve high precision micromachining of thin metallic films or foils that are supported by non-conducting or poorly conducting surfaces. In the field of microelectronics, thin films for the most part need to be patterned in order to form functional resistors, capacitors or conductors. This patterning of thin films is accomplished by a series of photolithographic and etching techniques.

The sequence of fabrication for a microelectronics circuit begins with the application of a layer of photoresist to the surface of a sample of metallic film or foil. The photoresist, which is a polymeric mixture, is then dried and exposed to ultraviolet (UV) light through a photographic mask of the required pattern. Usually, each sample is mounted into a step-and-repeat machine that holds the mask above a special reducing lens. The machine exposes the mask to a portion of the sample, then moves to the next position and exposes it again, doing this repeatedly until the pattern has filled the surface area of the sample. The sample is then removed from the machine and the unexposed resist is stripped away. The sample is then heated to polymerize the remaining photoresist which acts as a protective layer during the etching step. After etching, the remaining photoresist can be removed by a solvent leaving the required thin film pattern on the sample.

One such electronic component involving high precision micromachining is the slider suspension which is used in disk file electronics. A particular type of integrated slider suspension, comprises a sandwich of stainless steel/Kapton/copper films in which a 75 micron thick stainless steel foil is laminated on one side of a 6 micron thick Kapton film and a 12.5 micron thick copper film on the other side of the Kapton film. Both metallic layers are patterned with photoresist (5 microns thick). The fabrication of integrated slider suspensions involves the one sided through-mask micromachining of the photoresist patterned metallic layers. In the past, the process of chemical etching alone has been extensively used to fabricate these components without much success. A few of the principal problems of chemical etching for such applications include its inability to yield straight walls and its slow speed. In addition, because the process of chemical etching is so highly selective in nature, it requires different processes for stainless steel and copper.

The method of electrochemical machining (ECM) of metal workpieces is well known. It is the atom-by-atom removal of a metal by anodic corrosion at high speed. In a chemical reaction, the electron transfer between the reacting species takes place by the loss of electrons of one species, i.e., oxidation, and the gain of electrons of another species, i.e., reduction, at the same site. For an electrochemical reaction to occur, however, the oxidation must take place at a site remote from the reduction. In order to accomplish this situation, an electrolyte is interposed between the sample (anode) at which oxidation occurs and the site where reduction occurs (cathode).

With respect to the maskless ECM process, the metal workpiece which is to be shaped is the anode and the electrochemical machining tool that produces the shaping is the cathode. A low voltage source of direct current (dc) is connected to the electrodes. While the cathode and anode are held in position by a properly designed fixture, a solution of a strong electrolyte is pumped between the two electrodes. If no side reactions occur in the ECM process, the passage of each Faraday of electrical charge results in the dissolution of an equivalent weight of metal.

The process of electrochemical machining is widely employed in the automobile and aerospace industries. For examples of the uses of the ECM process, see U.S. Pat. Nos. 3,235,475; 3,276,988 and 4,083,767 and British Patent No. 933,731. These references all relate to the electrochemical shaping and finishing of large parts. Heretofore the ECM technique has not been practiced in the production of thin metallic films or foils.

The present invention relates to the use of the electrochemical machining process in the fabrication of microcomponents by through mask etching of thin foils and films to produce high precision features in the ranges of microns. In order to achieve such dimensions with uniformity and precision, an electrochemical machining tool will be required which can provide both a high rate of mass transport and uniform current distribution at the surface. Furthermore, for thin films supported by insulating material, problems arising from the loss of electrical contact during the process will have to be overcome.

SUMMARY OF THE INVENTION

The present invention discloses a tool for the electrochemical micromachining of a sample comprising a container means for receiving and temporarily retaining an electrolytic solution from a supply source for said solution; a cathode assembly positionable within said container means, said cathode assembly comprising receptacle means for supplying the electrolytic solution from said container means, and nozzle means for receiving said electrolytic solution from said receptacle means and directing said electrolytic solution against the sample; plate means positioned above said cathode assembly for holding the sample facing towards said cathode assembly at a variable distance therefrom; and power supply means having a negative terminal connected to said cathode assembly and a positive terminal connected to the sample. The interelectrode spacing, i.e., the distance between the sample and the cathode assembly, may be manually adjusted. In addition, either the plate means or the cathode assembly may be movable in a lateral direction in order that the electrolytic solution can be impinged against the entire sample by either moving the sample laterally over the cathode assembly or by moving the cathode assembly laterally beneath the sample. The latter scenario is preferable as it can save space when large samples are being micromachined.

The present invention further discloses a method for electrochemical micromachining of a sample comprising the steps of mounting the sample on a plate means above a cathode assembly, making the sample and said cathode assembly respectively an anode and cathode in an electrical circuit, adjusting the interelectrode spacing between the sample and said cathode assembly to a distance sufficient to keep the anode and cathode from interfering with one another while also maintaining a charge therebetween, continuously conducting an electric current through the electrical circuit, and continuously circulating an electrolytic solution through said cathode assembly so that the electrolytic solution impinges against the sample as an electrolytic shower to effectively etch the sample.

The tool and the method of the present invention is to be used in the fabrication of microelectronic components and are particularly useful in the one sided through-mask micropatterning of conducting foils and films supported by insulating material.

More specifically, the present invention relates to an electrochemical micromachining method to be used in the fabrication of slider suspensions. Because the anodic shape changes can be created in a controlled way by the application of an external current, the electrochemical process of metal removal offers better control over the micromachining process than chemical etching. Other advantages include a higher machining rate and the utilization of inert electrolytes. Furthermore, the potential dependence of metal dissolution reactions can be used for the selective dissolution of a metallic layer in the presence of another. By selecting the proper electrical and hydrodynamic conditions, the same electrolyte can be employed for the micromachining of several different materials. In addition, due to the fact that variations in current density act as a function of the substrate shape and cell geometry, electrochemical micromachining can yield anisotropic results. In order to obtain such directional effects during electrochemical machining, a high rate of impingement of the electrolytic solution at the active surface is required.

BRIEF DESCRIPTION OF THE DRAWINGS

FIG. 4a represents a sample which has had no modifications made thereto.

FIG. 4b represents the same sample as shown in FIG. 4a, except that it has been modified by the placement of a small plating tape over a particular region.

DETAILED DESCRIPTION OF THE PREFERRED EMBODIMENT OF THE INVENTION

Figure 1:
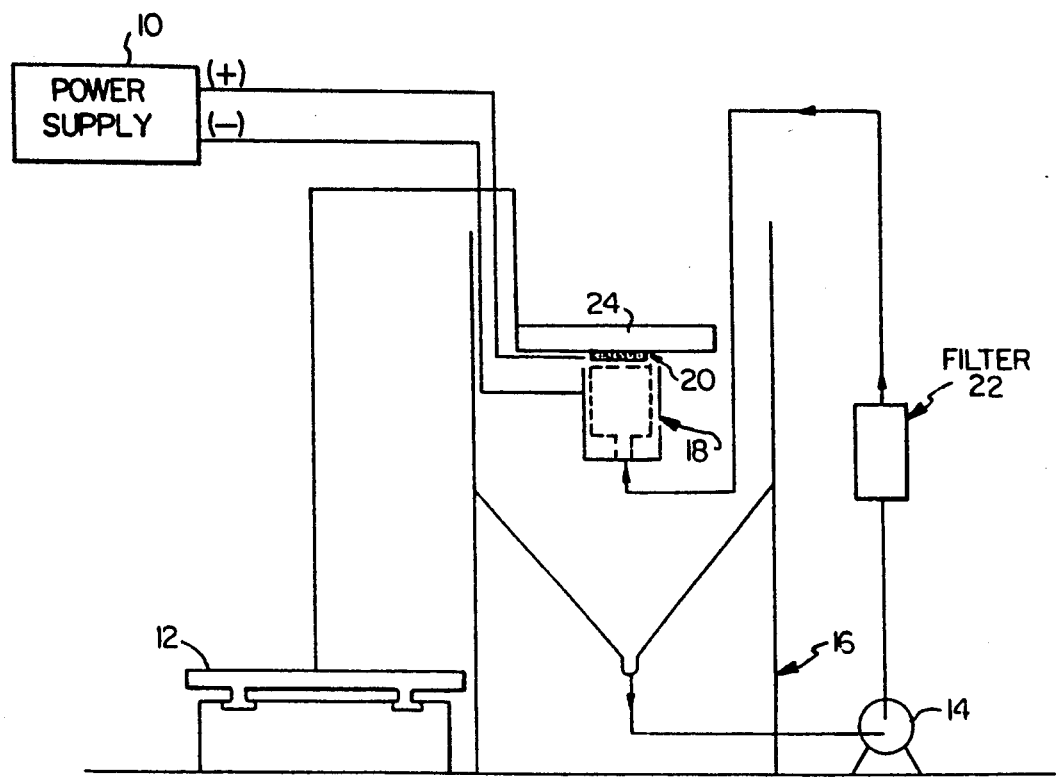
FIG. 1 is a schematic drawing of the tool of the present invention for the electrochemical micromachining of a workpiece.

A schematic drawing of the electrochemical micromachining tool of the present invention is shown in FIG. 1. It consists of a container means (16) which acts as the reservoir for the electrolyte, a sample holder (24), which can be attached to a moving stage (12), positioned above the cathode assembly (18), a power supply means (10) with its negative terminal connected to said cathode assembly (18) and its positive terminal connected to the sample (20), and a fluid supply means consisting of a pump (14) and a filter (22) for supplying said electrolyte to said cathode assembly (18). The electrolyte is pumped from the tank (16) through the filter (22) into the cathode assembly (18) from where is comes out as an electrolytic shower, impinging against the sample or work piece anode (20). The electrolyte then falls by gravity into the reservoir for reuse.

Figure 2C:
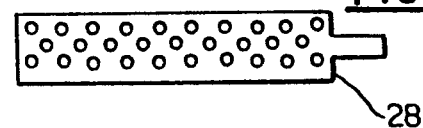
FIGS. 2a, 2b and 2c represent detailed schematic drawings of the multinozzle cathode assembly of the tool of the present invention for electrochemical micromachining.
Figure 2A:
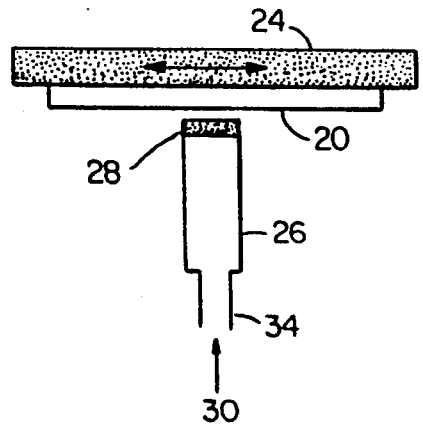
Figure 2B:
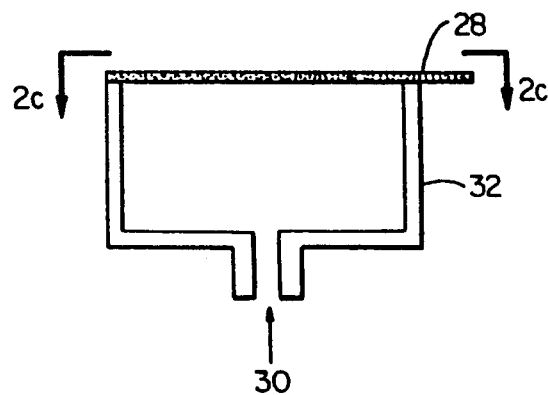

FIGS. 2a, 2b and 2c show the details of the cathode assembly. The multinozzle cathode assembly is comprised of a nozzle assembly (26), shown in FIG. 2a encompassed by an enclosure means (32), shown in FIG. 2b. The nozzle assembly (26) is comprised of receptacle means (34) for supplying the electrolytic solution (30) from the container means, and nozzle means or nozzle plate (28) for receiving said electrolytic solution (30) from said receptacle means (34) and directing said electrolytic solution (30) against said sample (20). The nozzle plate (28), shown in FIG. 2c, also acts as the cathode and is mounted over the enclosure (32) with a narrow opening at one end through which the electrolyte (30) enters the receptacle means (34) and fills the enclosure before it comes out through the nozzle means of the nozzle assembly (26) as electrolyte shower. The sample (20) is mounted on the sample holder (24) and is positioned at a desired distance from the cathode nozzle plate (28). The interelectrode distance can be adjusted by a teflon spacer controlling means (not shown) attached to the cathode assembly. The sample can either be laterally moved to and fro over the multinozzle cathode assembly or the multinozzle cathode assembly can be laterally moved to and fro beneath the sample if the electrolytic shower does not impinge onto the entire sample in a stationary mode. The speed at which the electrolytic shower will move across the sample and the stroke of the sample may be adjusted as desired.

The electrochemical micromachining tool of the present invention provides conditions of high speed electrolyte impingement upon the workpiece thus permitting the effective removal of the dissolved products and of the heat generated by joule heating. The tool is suitable for the electrochemical micromachining of various samples of different sizes. In the case of samples which are much larger than the nozzle width, the active area during the micromachining process is defined by the electrolyte which is in contact with the part of the sample. For a stationary sample, the current distribution varies over the surface of the sample. The current, and hence the metal removal rate, is high and uniform in the region of impingement while a gradual drop of current as a function of distance away from the impingement region leads to low metal removal rates. The to and fro lateral movement of the sample or cathode assembly serve to equalize the distribution of the metal removal rate by compensating for the stray current effect. This is accomplished as every part of the sample undergoes both high current as well as stray current regions in cycle.

With slight modifications, the tool can be used for the electrochemical micromachining of parts contained in large sheets, plates and cards. The skilled artisan can appreciate that by using a large multinozzle assembly or a series of carefully separated multinozzle cathode assemblies, a large area or a specifically designed removal of metal may be achieved. The tool of the present invention can also be employed for applications involving continuous flow manufacturing.

The choice of an electrolyte for the electrochemical machining process is generally a salt solution, for example, solutions of sodium chloride, sodium nitrate and sodium sulfate. For the purpose of the electrochemical micromachining process of the present invention, one having ordinary skill in the art will appreciate that a neutral salt solution is best. One of the advantages which a neutral salt solution has is the fact that the metal ions which are formed during anodic dissolution go into the solution and form hydroxide precipitates which can then be easily filtered out. Consequently, these solutions require very little regeneration efforts. Another advantage is that because metal ions do not remain in the solution, metal deposition at the cathode is not an issue. Only hydrogen evolution occurs at the cathode. Yet another advantage to the use of neutral salt solutions is that they do not pose any safety threat to the operator. Concentrated salt solutions generally produce the best results as they are of high conductivity and generally give high rates of metal dissolution. It should be noted, however, that the solution concentration is limited by the solubility of a given salt. Consequently, the concentrations of sodium nitrate and sodium chloride solutions, for example, may range between about 1M and about 5M, while for sodium sulfate, about 0.5M is close to its solubility limit in water. Again, it will be appreciated by the skilled artisan that a nitrate solution is preferable because under normal conditions, nitrate ions do not pose any corrosion problems. The nitrate salt solution is therefore compatible with many metallic materials.

The container means and the enclosure means may be formulated from a material resistant to the electrolyte being used, such as plexiglass, PVC and the like.

The choice of the cell voltage has a significant influence on the rate of dissolution and surface finish. One skilled in the art will appreciate that high cell voltage is preferred in order to achieve a high rate of material removal and good surface finish. In addition, choosing a relatively high flow rate of the electrolyte is preferable to a lower flow rate as it enables one to obtain high rates of material removal and to obtain surfaces which are free of reaction products. The choice of flow rate will also be dependent upon the size of the sample being micromachined. The larger the sample, the greater the volumetric flow rate.

The interelectrode spacing which is to be used in the electrochemical micromachining process should neither be too large nor too small, generally varying between 1 and 3 mm. An interelectrode spacing which is too small is undesirable as the anodic and cathodic reaction products may interfere with one another and lead to sparking and the damaging of the workpiece being machined. On the other hand, an interelectrode spacing which is too wide will lead to the need for higher cell voltage. Although the speed of the sample may be varied as well, as indicated earlier, a relatively high speed of sample movement is not preferable as it may cause a lack of contact between the electrolyte and the whole surface of the sample. A general range of proper sample speed would be from about 0.2 cm/s to about 0.6 cm/s.

Figure 6A:
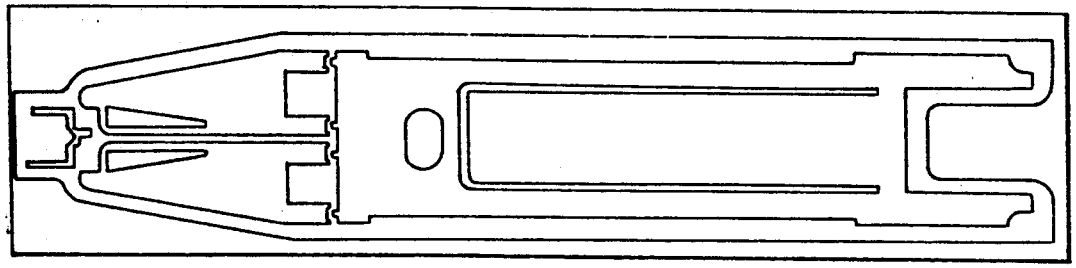
FIG. 6a illustrates the integrated slider suspension design, showing the stainless steel side thereof.

FIG. 6a shows the design of the stainless steel side of an integrated slider suspension and is presented to demonstrate the complications and challenges that are to be encountered during the micromachining of such components. The shaded parts of the figure represent the photoresist mask. The unmasked exposed openings are to be micromachined to fabricate the slider suspension. It should be noted in particular that the exposed openings are of different dimensions even though they are to be etched with the same undercutting. The pattern openings vary between 100 and 2100 microns on the stainless steel film and between 50 and 1600 microns on the copper film.

The method of the present invention also discloses the additional steps of initially masking a region of maximum opening in the sample and introducing dummy photoresist artwork in regions of wide openings in the sample as well.

The following examples are provided to further illustrate the present invention.

EXAMPLE I

A cathode assembly consisting of a nozzle plate comprised of a one inch wide, $\frac{1}{8}$ inch thick stainless steel plate containing an array of circular holes, $\frac{1}{8}$ inch in diameter, with a spacing of $\frac{1}{8}$ inches from its neighboring hole in each direction was used. The container means, as well as the enclosure means, were made of plexiglass. The electrolyte flow rate was maintained constant at 1 gpm (gallon per minute) and the interelectrode spacing was adjusted to 1.5 mm. The integrated slider suspension sample was moved over the multinozzle cathode assembly at a speed of 0.4 cm/s.

Two different electrolytes were tested. The first was sodium nitrate and 100 ppm fluorocarbon based surfactant and the second was sodium chloride and 100 ppm fluorocarbon based surfactant. The sodium nitride and sodium chloride were made by 3M ®. A small amount of the fluorocarbon based surfactant was found to be effective in wetting the surface of the sample and thereby uniformly initiating the metal dissolution reaction over the surface. Although the surfactant used was FC-98, made by 3M ®, any non-foaming surfactant can be employed and serve the same purpose. The sodium nitrate concentration was found to be preferred from a conductivity and solubility point of view.

In both the above indicated electrolytes, high cell voltage (or current density) led to the production of straight walls, higher dissolution rate and a smooth electropolished surface. Good results were obtained with voltages of between about 5 and about 15 volts, with optimum results achieved at about 12 volts for stainless steel and about 9 volts for copper.

Using the above-indicated experimental conditions and a stationary cathode assembly, four passes were sufficient for the electrochemical micromachining of the stainless steel patterns while three passes were sufficient for the copper patterns. One skilled in the art will realize that the number of passes is related to the speed of the sample. That is, the higher the speed of the sample, the more number of passes which are required. It should also be evident to the skilled artisan that the number of passes is equally dependent on the thickness of the material to be removed on the sample. Depending on the number of samples per workpiece, i.e., the sample size, the stroke distance per pass was adjusted. For the 7.6 cm diameter workpiece with 6 integrated slider suspensions sample of the present example, the stroke distance was kept at 10 cm. The electrochemical micromachining of the stainless steel patterns was completed in four passes and required only 100 seconds.

EXAMPLE II

Figure 3B:
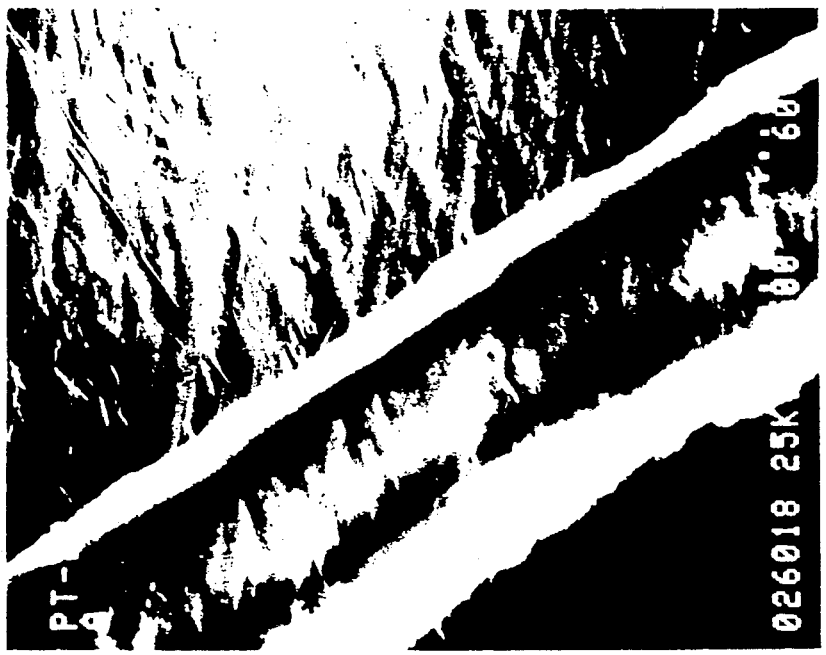
FIGS. 3a and 3b are scanning electronic microscopy (SEM) photographs of completely etched regions of stainless steel samples electrochemically micromachined by the tool of the present invention showing smooth surfaces (FIG. 3a) and straight walls (FIG. 3b)
Figure 3A:

FIGS. 3a and 3b are SEM photographs taken of completely etched regions of stainless steel samples which have been electrochemically micromachined by the tool of the present invention. The highly smooth surfaces and straight walls which were obtained can easily be seen in FIGS. 3a and 3b respectively. Such results, however, were limited to only a certain range of openings. Two different problems were identified during the electrochemical micromachining of both the stainless steel as well as the copper patterns. The first involved the loss of electrical contact at certain locations in large openings. This led to the formation of isolated islands of unetched material in those regions. The second problem was the overall loss of electrical contact which resulted in the premature stoppage of the electroetching process.

Figure 4A:
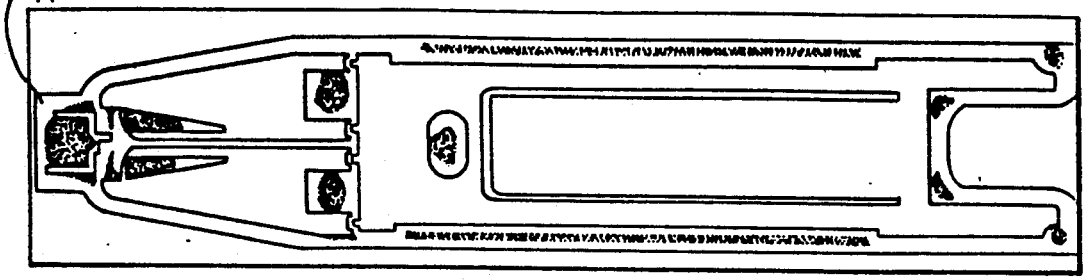
FIGS. 4a and 4b are schematic drawings of electrochemically micromachined samples of integrated slider suspensions.
Figure 4B:
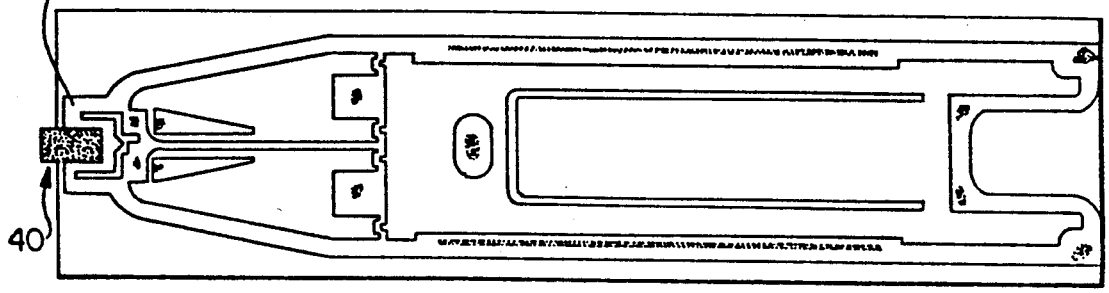

Step-wise experiments were performed on the same sample in order to determine the region where the electrical contact was lost. It was found that the loss of electrical contact took place at the region of maximum opening. Subsequently, the region of the maximum opening was masked by a plating tape and the experiments repeated. The plating tape can be any type of an insulating tape with adhesive that is resistant to high temperatures, acids and alkali. The results of the micromachining behavior on the sample with the maximum opening masked by a plating tape were much improved. The results are illustrated in FIGS. 4a and 4b. FIGS. 4a represents the electrochemically micromachined sample without any modification made thereto. The dark regions inside the various openings depict the unetched islands of material. The region of the maximum opening is indicated as Region A. FIG. 4b shows the same sample, except, that Region A has been covered by a small plating tape (40). The dark regions inside the various openings of FIG. 4b are much less and represent a vast improvement in the micromachining or etching behavior. The narrowing down of the wide opening of Region A prevented the loss of electrical contact at that location and led to the great improvement in underetching. Although there is much less unetched material shown in FIG. 4b then in FIG. 4a, the problems arising from the loss of electrical contact is still noticeable as islands of unetched material can still be observed in FIG. 4b.

EXAMPLE III

Figure 5A:
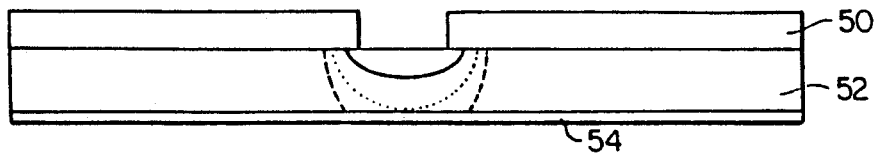
FIGS. 5a, 5b and 5c are schematic drawings illustrating the problem of the formation of islands of unetched material in wide openings of workpieces (FIG. 5b) as compared to more narrow openings (FIG. 5a) and one useful solution to said problem by the use of dummy photoresist art work (FIG. 5c).
Figure 5B:
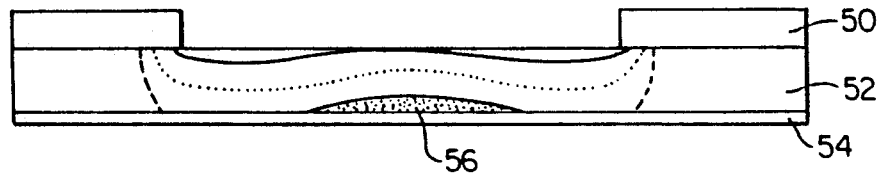
Figure 5C:
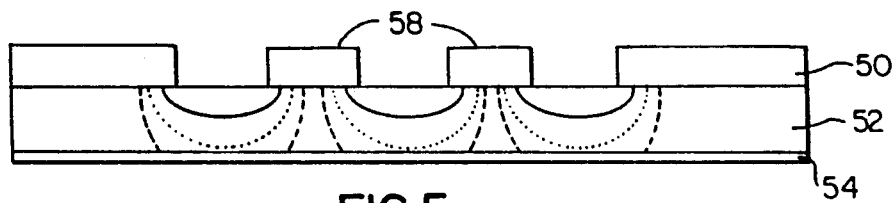

It was further found that the remaining unetched regions described above in relation to the sample represented by FIG. 4b arose from the non-uniform current distribution problems which occurred on the dissolving surfaces of existing wide openings This problem and a method of solution are illustrated in FIG. 5. FIGS. 5a, 5b and 5c show sample workpieces, each consisting of a metal film (52) deposited on a polyamide (54) and coated with photoresist (50) and having various sizes of openings. As the electrochemical micromachining process proceeded with time, the boundary of an existing cavity continually changed. The changing boundary line is represented in each of the cavities in FIGS. 5a, 5b, and 5c.

Kuiken (*Proc. R. Soc.*, A392, 199-225, 1984) has developed the mathematical modeling of the moving boundary for chemical etching where the etchant species has been considered to be diffusion controlled. It has been shown that for sufficiently wide openings, etching occurs faster at the edges of the opening than at its center, and produces the well-known bulge effects at the corners of the openings. Similar phenomena has been found to occur during the electrochemical micromachining of wide openings. As shown in FIG. 5b, more etching occurred at the edges of the opening. In addition, due to the faster rate of dissolution at the edges of the opening, an island of unetched material (56) remained which lost contact with the rest of the metallic surface. This problem was resolved, in principle, by converting the wide opening situation depicted in FIG. 5b to a situation concerning a number of more narrow openings more similar to FIG. 5a where the problem was at a minimum. This was achieved by the introduction of dummy photoresist artwork (58) as shown in FIG. 5c. The process of introducing dummy photoresist artwork involves the inclusion of some otherwise nonfunctional patterns (lines and the like) in the photolithography step. For best results, the dimensions of the dummy photoresist artwork should match the undercutting of the dummy photoresist artwork from both sides such that as the micromachining process is completed in the vertical direction, the dummy photoresist falls off yielding a clean straight walled micromachined wide trench.

In order to design the dimensions of the dummy photoresist artwork, a knowledge of undercutting and its dependence on the width of the opening is required. The undercutting has been experimentally determined by measuring the initial photoresist opening and the dimension of the trench formed after electrochemical micromachining. The latter dimensions were measured after removing the photoresist layer. Said measurements were performed only for micromachined trenches which were completely etched, i.e., without any unetched material remaining within the trenches. The results indicated that the undercutting is independent of the line opening and mainly dependent on the thickness of the metallic layer undergoing the micromachining. For 75 micron thick stainless steel, an average value of undercutting was 50 microns. For 12.5 micron thick copper, an average value of undercutting was 6 microns.

Figure 6B:
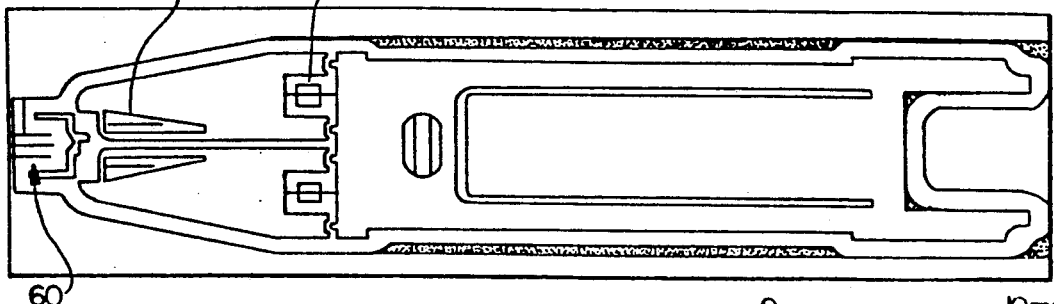
FIG. 6b illustrates a suggested artwork design modification to the said integrated slide suspension design.

Based on the above-described experimental results, photoresist artwork design modifications are suggested that include the introduction of dummy art work and the reduction of the large openings wherever possible. A suggested modified art work design for the stainless steel side of the integrated slider suspension is shown in FIG. 6. As indicated earlier, FIG. 6a represents the design of an integrated slider suspension without any modifications. The dummy photoresist lines (60), 100 microns wide (2× undercutting) can be seen in FIG. 6b. It should be noted that some of the dimensions in the present artwork of FIG. 6a are not functional, i.e. not necessary for the proper use of the integrated slider suspension, and can be reduced without any adverse effect on the functioning of the component.

Figure 7A:
FIGS. 7a and 7b are SEM photographs of actual work regions electrochemically micromachined by the tool of the present invention showing the elimination of the problem of island formation (shown in FIG. 7a) by a narrowing of the existing opening (shown in FIG. 7b).
Figure 7B:
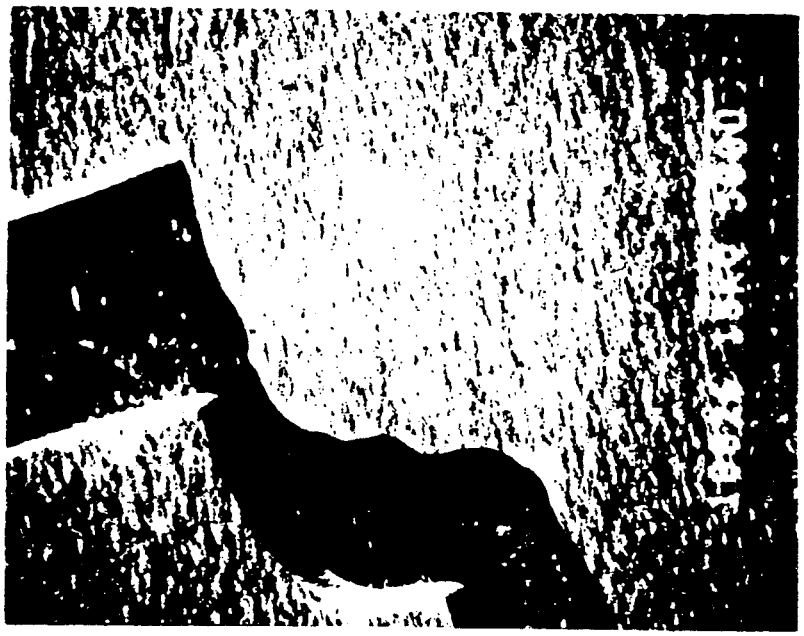

It has been shown above that the problems related to the loss of electrical contact during the electrochemical micromachining process can indeed be eliminated by reducing the size of existing openings. FIG. 7 illustrates the results of the elimination of the problem of island formation by narrowing the opening. FIG. 7a is a SEM photograph showing a work region with a wide opening which after being electrochemically micromachined has remaining unetched material which can be easily seen. The SEM photograph of FIG. 7b is of a work region where the opening had been reduced by the application of a lacquer. As is illustrated by the photograph in FIG. 7b, the product is clean after the electrochemical micromachining process.

The concept of introducing dummy photoresist art work involves a delicate balance between the lateral and the vertical dissolution on the one hand and the width of the dummy photoresist on the other hand. The choice of the proper dummy artwork dimensions will lead to a complete removal of the material from the trenches. Under conditions where some last traces of unetched materials are difficult to be removed by the electrochemical micromachining process, the process of chemical etching may be used to effectively remove the unetched islands without significantly altering the wall angle. Since only very small amounts of material are to be removed by the chemical etching method, a two-step process involving both electrochemical micromachining and chemical etching would be much more effective than a chemical etching process alone.

While the invention has been particularly shown and described with respect to a preferred embodiment thereof, it will be understood by those skilled in the art that the foregoing and other changes in form and details may be made therein without departing from the spirit and scope of the invention.

Having thus described our invention, what we claim as new, and desire to secure as Letters Patent is:

1. A tool for electrochemical micromachining of a sample comprising:
   container means for receiving and temporarily retaining an electrolytic solution from a supply source for said solution;
   a cathode assembly positionable within said container means, said cathode assembly comprising receptacle means for supplying the electrolytic solution from said container means, and nozzle means for receiving said electrolytic solution from said receptacle means and directing said electrolytic solution against said sample;
   plate means for holding the sample facing towards said cathode assembly at a variable distance therefrom, said sample having a photoresist mask deposited on a portion of one side of the surface of said sample,
   lateral movement means for providing relative lateral movement between said sample and said cathode assembly; and
   power supply means having a negative terminal connected to said cathode assembly and a positive terminal connected to said sample.

2. A tool according to claim 1, wherein said lateral movement means provides lateral movement to said plate means to provide lateral displacement of the sample relative to said cathode assembly.

3. A tool according to claim 1, wherein said lateral movement means provides lateral movement to said cathode assembly to provide lateral displacement of said cathode assembly relative to the sample.

4. A tool according to claim 1, wherein an enclosure encompasses said cathode assembly and a nozzle plate mounting said enclosure means is arranged thereon so as to form a cover.

5. A tool according to claim 4, wherein said nozzle plate has an array of circular holes comprising said nozzle means from which the electrolytic solution impinges against the sample as an electrolytic shower.

6. A tool according to claim 1, wherein said container means is operatively connected to a pump, filter and said receptacle means of said cathode assembly.

7. A method for electrochemical micromachining of a sample comprising the steps of:
   (a) mounting a sample on a plate means facing towards a cathode assembly;
   (b) making the sample and said cathode assembly respectively an anode and cathode in an electrical circuit;
   (c) adjusting the interelectrode spacing between the sample and said cathode assembly to a distance effective to keep the anode and cathode from interfering with one another while also maintaining a charge therebetween;
   (d) providing relative lateral movement between said sample and said cathode assembly;
   (e) continuously conducting an electric current through the electrical circuit; and
   (f) continuously circulating an electrolytic solution through said cathode assembly so that the electrolytic solution impinges against the sample as an electrolytic shower to effectively etch the sample.

8. A method according to claim 7, wherein said electrolytic solution comprises a neutral salt solution.

9. A method according to claim 8, wherein said neutral salt solution essentially consists of sodium nitrate.

10. A method according to claim 8, wherein said neutral salt solution essentially consists of sodium chloride.

11. A method according to claim 7, wherein said electrolytic solution includes a non-foaming surfactant.

12. A method according to claim 11, wherein said electrolytic solution is comprised of sodium nitrate and 100 ppm surfactant.

13. A method according to claim 11, wherein said electrolytic solution is comprised of sodium chloride and 100 ppm surfactant.

14. A method according to claim 7, wherein the cell voltage is between about 5 volts and about 15 volts.

15. A method according to claim 7, wherein the cell voltage is between about 9 volts and about 12 volts.

16. A method according to claim 7, wherein said interelectrode spacing is at a distance of from about 1 mm to about 3 mm.

17. A method according to claim 16, wherein said interelectrode spacing is about 1.5 mm.

18. A method according to claim 7, wherein the electrolytic solution impinges against the sample at a flow rate of about 1 gpm.

19. A method according to claim 7, wherein said plate means is laterally movable to displace the sample at a speed of about 0.2 cm/s to about 0.6 cm/s.

20. A method according to claim 7, wherein said plate means is laterally movable to displace the sample at a speed of 0.4 cm/s over said cathode assembly.

21. A method according to claim 7, wherein said cathode assembly is laterally movable to displace the sample at a speed of about 0.2 cm/s to about 0.6 cm/s.

22. A method according to claim 7, wherein said cathode assembly is laterally movable to displace the cathode assembly at a speed of about 0.4 cm/s.

23. A method according to claim 7, which comprises the step of initially masking a region of a maximum opening in the sample before step (a).

24. A method according to claim 23, wherein said region of maximum opening is masked with a plating tape.

25. A method according to claim 7 which comprises the step of introducing dummy photoresist artwork into regions of wide openings in the sample prior to step (a).

26. A method according to claim 25, wherein said dummy photoresist artwork matches the undercutting of said dummy photoresist artwork from opposite sides thereof.

27. A method according to claim 23, which comprises the step of introducing dummy photoresist artwork into regions of wide openings in the sample prior to step (a).

28. A method according to claim 27, wherein said dummy photoresist artwork matches the undercutting of said dummy photoresist artwork from opposite sides thereof.

29. The method according to claim 7, wherein the sample is a thin metallic film supported by non-conducting or poorly conducting surfaces.

30. The method according to claim 29, wherein the thin metallic film is a slider suspension.

31. The method according to claim 30, wherein said slider suspension is a integrated slider suspension.

* * * * *